United States Patent
Watsuji et al.

(10) Patent No.: US 7,368,657 B2
(45) Date of Patent: May 6, 2008

(54) PASTE COMPOSITION AND SOLAR CELL EMPLOYING THE SAME

(75) Inventors: Takashi Watsuji, Osaka (JP); Gao-Chao Lai, Osaka (JP); Tomohiro Machida, Osaka (JP); Satoshi Tanaka, Osaka (JP); Masaomi Hioki, Osaka (JP)

(73) Assignees: Toyo Aluminium Kabushiki Kaisha, Osaka (JP); Sharp Kabushiki Kaisha, Osaka (JP)

( * ) Notice: Subject to any disclaimer, the term of this patent is extended or adjusted under 35 U.S.C. 154(b) by 626 days.

(21) Appl. No.: 10/610,886

(22) Filed: Jul. 2, 2003

(65) Prior Publication Data

US 2004/0003836 A1 Jan. 8, 2004

(51) Int. Cl.
*H01L 31/0224* (2006.01)
(52) U.S. Cl. ............... 136/256; 136/243; 252/518.1
(58) Field of Classification Search ........ 136/243–265; 252/518.1
See application file for complete search history.

(56) References Cited

U.S. PATENT DOCUMENTS

2001/0029977 A1* 10/2001 Oya .................... 136/256
2004/0144419 A1* 7/2004 Fix et al. ............. 136/252

FOREIGN PATENT DOCUMENTS

| | | | |
|---|---|---|---|
| DE | 199 10 816 A1 | 10/2000 | |
| EP | 1 036 849 A2 | 9/2000 | |
| JP | 7-22634 A | 1/1995 | |
| JP | 7-73731 A | 3/1995 | |
| JP | 2000-090734 A | 3/2000 | |
| JP | 2001-293593 A | 10/2001 | |
| JP | 2001-313402 A | 11/2001 | |
| JP | 2002-217435 A | 8/2002 | |
| JP | 2003-69056 A | 3/2003 | |

\* cited by examiner

*Primary Examiner*—Nam Nguyen
*Assistant Examiner*—Anthony Fick
(74) *Attorney, Agent, or Firm*—Birch, Stewart, Kolasch & Birch, LLP

(57) ABSTRACT

A paste composition for forming an electrically conductive layer on a p-type silicon semiconductor substrate comprises aluminum powder, an organic vehicle and powder of at least one inorganic compound selected from a group consisting of an oxide-based inorganic compound and a non-oxide-based inorganic compound. The oxide-based inorganic compound has a thermal expansion coefficient smaller than the thermal expansion coefficient of aluminum and a melting temperature, a softening temperature and a decomposition temperature each higher than the melting point of aluminum. The non-oxide-based inorganic compound has a thermal expansion coefficient smaller than the thermal expansion coefficient of aluminum and at least one of a melting temperature, a softening temperature or a decomposition temperature higher than the melting point of aluminum. A solar cell comprises an electrically conductive layer formed by applying the paste composition having the aforementioned characteristics onto a p-type silicon semiconductor substrate and thereafter firing the paste composition.

9 Claims, 1 Drawing Sheet

PASTE COMPOSITION AND SOLAR CELL EMPLOYING THE SAME

BACKGROUND OF THE INVENTION

1. Field of the Invention

The present invention generally relates to a paste composition and a solar cell employing the same, and more specifically, it relates to a paste composition employed for forming an electrically conductive layer such as an impurity layer or an electrode layer on a p-type silicon semiconductor substrate constituting a crystal silicon solar cell.

2. Description of the Background Art

A solar cell is known as an electronic component having electrodes formed on a p-type silicon semiconductor substrate. As shown in FIG. 1, such a solar cell is formed by a p-type silicon semiconductor substrate 1 having a thickness of 300 to 400 μm. An n-type impurity layer 2 having a thickness of 0.3 to 0.5 μm, an anti-reflective coating 3 and grid electrodes 4 are successively formed on a photoreceptive surface of the p-type silicon semiconductor substrate 1.

A back electrode layer 5 is formed on the back surface of the p-type silicon semiconductor substrate 1. This back electrode layer 5 is formed by applying a paste composition comprised of aluminum powder, glass frit and an organic vehicle by screen printing or the like, drying the same and thereafter firing the same at a temperature of at least 660° C. (the melting point of aluminum). In this firing, aluminum diffuses into the p-type silicon semiconductor substrate 1, thereby forming an Al—Si alloy layer 6 between the back electrode layer 5 and the p-type silicon semiconductor substrate 1 while simultaneously forming a $p^+$ layer 7 as an impurity layer resulting from diffusion of aluminum atoms. The solar cell attains a BSF (back surface field) effect improving collection efficiency for formed carriers due to the presence of the $p^+$ layer 7.

Another type of solar cell is put into practice by removing the back electrode layer 5 and the Al—Si alloy layer 6 with acid or the like while leaving the $p^+$ layer 7 for ensuring the BSF effect and newly forming an electrode layer with silver paste or the like.

In order to reduce the cost for such a solar cell, means of reducing the thickness of the p-type silicon semiconductor substrate has recently been studied. When reduced in thickness, however, the p-type silicon semiconductor substrate is so deformed that the back surface formed with the back electrode layer by firing the paste composition is concaved due to the difference between the thermal expansion coefficients of silicon and aluminum, to result in warping. Therefore, cracking or the like is caused in steps of manufacturing the solar cell, to disadvantageously reduce the manufacturing yield of the solar cell.

In order to solve this problem, the quantity of the applied paste composition may be reduced to reduce the thickness of the back electrode layer. When the quantity of the applied paste composition is reduced, however, the quantity of aluminum diffusing into the p-type silicon semiconductor substrate from the surface thereof is insufficient. Consequently, no desired BSF effect can be attained and thus the characteristics of the solar cell are disadvantageously reduced.

In this regard, Japanese Patent Laying-Open No. 2000-90734, for example, discloses the composition of electrically conductive paste capable of ensuring desired characteristics of the solar cell and reducing the thickness of the back electrode layer. This electrically conductive paste contains an aluminum-containing organic compound in addition to aluminum powder, glass frit and an organic vehicle. However, the aforementioned prior art reduces the thickness of the back electrode layer thereby reducing the quantity of warping caused in the p-type silicon semiconductor substrate. Under the present circumstances, there is developed neither method nor composition of electrically conductive paste for reducing the quantity of warping without reducing the quantity of the applied electrically conductive paste for sufficiently attaining a desired BSF effect.

SUMMARY OF THE INVENTION

In order to solve the aforementioned problem, an object of the present invention is to provide a paste composition capable of sufficiently attaining a desired BSF effect without reducing the quantity of application also when the thickness of a p-type silicon semiconductor substrate is reduced while inhibiting the p-type silicon semiconductor substrate from deformation after firing and a solar cell comprising an impurity layer or an electrode layer prepared from the composition.

The inventors have made deep study in order to solve the problem of the prior art, to find out that the aforementioned object can be attained by using a paste composition having a specific composition. On the basis of this recognition, the paste composition according to the present invention has the following characteristics:

The inventive paste composition, employed for forming an electrically conductive layer on a p-type silicon semiconductor substrate, comprises aluminum powder, an organic vehicle and powder of at least one inorganic compound selected from a group consisting of an oxide-based inorganic compound and a non-oxide-based inorganic compound. The oxide-based inorganic compound has a thermal expansion coefficient smaller than the thermal expansion coefficient of aluminum and a melting temperature, a softening temperature and a decomposition temperature each higher than the melting point of aluminum. The non-oxide-based inorganic compound has a thermal expansion coefficient smaller than the thermal expansion coefficient of aluminum and at least one of a melting temperature, a softening temperature or a decomposition temperature higher than the melting point of aluminum. The electrically conductive layer is an impurity layer or an electrode layer.

In the inventive paste composition, the oxide-based inorganic compound is preferably at least one selected from a group consisting of silicon oxide and aluminum oxide.

In the inventive paste composition, the non-oxide-based inorganic compound is preferably at least one selected from a group consisting of a carbide, a nitride and a boride.

The inventive paste composition preferably contains the powder of the inorganic compound in an amount of at least 0.3 mass % and not more than 10.0 mass %.

The inventive paste composition more preferably contains the aluminum powder in an amount of at least 60 mass % and not more than 75 mass %, the organic vehicle in an amount of at least 20 mass % and not more than 35 mass % and the powder of the inorganic compound in an amount of at least 0.3 mass % and not more than 10.0 mass %.

The inventive paste composition preferably further contains glass frit.

When the glass frit is present, the inventive paste composition preferably contains the aluminum powder in an amount of at least 60 mass % and not more than 75 mass %, the organic vehicle in an amount of at least 20 mass % and not more than 35 mass %, the powder of the inorganic compound in an amount of at least 0.3 mass % and not more than 10.0 mass % and the glass frit in an amount of not more than 5.0 mass %.

In the inventive paste composition, the mean particle size of the powder of the inorganic compound is preferably not more than 10 μm.

A solar cell according to the present invention comprises an electrically conductive layer formed by applying a paste composition having one of the aforementioned characteristics onto a p-type silicon semiconductor substrate and thereafter firing the paste composition. The electrically conductive layer is an impurity layer or an electrode layer.

According to the present invention, as hereinabove described, the p-type silicon semiconductor substrate coated with the paste composition comprising the powder of the inorganic compound satisfying the aforementioned conditions is so fired that a desired BSF effect can be maintained for improving collection efficiency for formed carriers without reducing the quantity of application and the fired p-type silicon semiconductor substrate can be prevented from deformation also when the thickness of the p-type silicon semiconductor substrate is reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
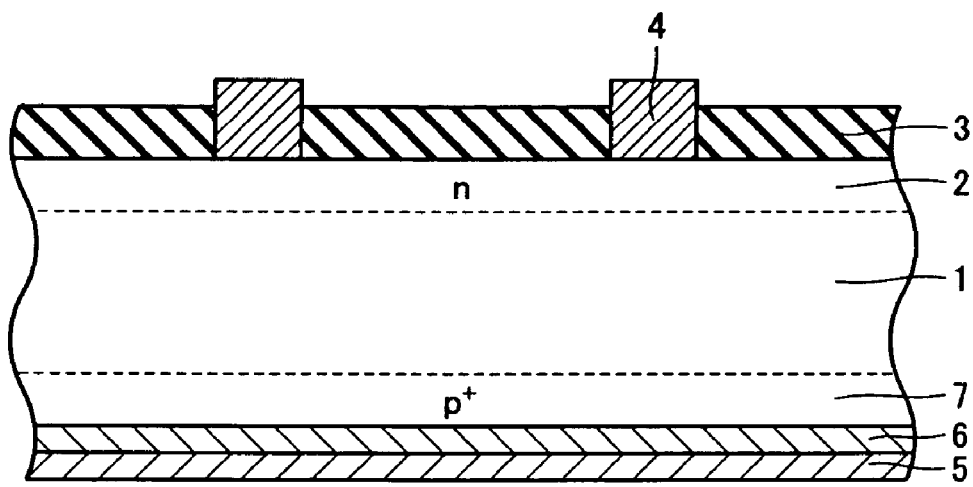
FIG. 1 typically illustrates the sectional structure of a solar cell to which the present invention is applied.

The paste composition according to the present invention comprises powder of an inorganic compound in addition to aluminum powder and an organic vehicle. The thermal expansion coefficient of the inorganic compound powder is smaller than that of aluminum. At least one of the melting temperature, the softening temperature or the decomposition temperature of the inorganic compound powder is higher than the melting point of aluminum. In other words, the inorganic compound powder is not melted, not softened and not decomposed at the firing temperature for the paste composition. This inorganic compound powder is so introduced into the paste composition that a p-type silicon semiconductor substrate coated with the paste composition and fired can be inhibited from deformation.

In general, it has been substantially the only effective means for suppressing deformation of a fired p-type silicon semiconductor substrate to reduce the thickness of a film of paste applied thereto. When the thickness of the film of the paste applied to the p-type silicon semiconductor substrate is reduced, the quantity of aluminum diffusing into the p-type silicon semiconductor substrate from the surface thereof is so insufficient that no desired BSF effect can be attained and as a result the characteristics of a solar cell formed by the p-type silicon semiconductor substrate are reduced. According to the present invention, however, the fired p-type silicon semiconductor substrate can be inhibited from deformation without reducing the thickness of the film of the paste thereto, whereby a desired BSF effect can be attained. While the reason why the fired p-type silicon semiconductor substrate can be inhibited from deformation by containing the aforementioned inorganic compound powder is not clear, the inorganic compound may suppress the degree of contraction of an aluminum sintered layer, formed when the paste composition is fired, in cooling after the firing.

The inorganic compound contained in the inventive paste composition may be at least one selected from a group consisting of a carbide, an oxide, a nitride and a boride, while the same is not restricted to these compounds.

The content of the inorganic compound powder in the inventive paste composition is preferably at least 0.3 mass % and not more than 10.0 mass %. If the content of the inorganic compound powder is less than 0.3 mass %, it is not possible to sufficiently inhibit the fired p-type silicon semiconductor substrate from being deformed by adding the inorganic compound powder. If the content of the inorganic compound powder exceeds 10.0 mass %, surface resistance of a back electrode layer may be disadvantageously increased to inhibit the sintering property of the paste composition. If the surface resistance of the back electrode layer is increased, inter-electrode ohmic resistance is so increased that energy resulting from irradiation with sunlight cannot be effectively taken out and energy conversion efficiency is reduced.

The mean particle size of the inorganic compound powder contained in the inventive paste composition is preferably not more than 10 μm. If the mean particle size of the inorganic compound powder exceeds 10 μm, the number of inorganic compound particles present in an aluminum sintered layer formed when the paste composition is fired is so reduced that it is not possible to satisfactorily inhibit the fired p-type silicon semiconductor substrate from deformation by adding the inorganic compound powder. The mean particle size of the inorganic compound powder, which cannot be industrially reduced to less than 0.01 μm, is at least 0.01 μm.

The content of the aluminum powder in the inventive paste composition is preferably at least 60 mass % and not more than 75 mass %. If the content of the aluminum powder is less than 60 mass %, surface resistance of the fired back electrode layer may be increased to reduce energy conversion efficiency of the solar cell. If the content of the aluminum powder exceeds 75 mass %, spreadability of the paste composition in screen printing or the like is reduced.

The organic vehicle contained in the inventive paste composition is prepared by dissolving, for example, nitro cellulose, polyvinyl butryal, ethyl cellulose, acrylic resin, alkyd resin or the like in a solvent. Exemplary solvents include but are not limited to solvents such as glycol ether-based solvent, diethylene glycol monobutylether, diethylene glycol monobutylether acetate, and dipropylene glycol monomethylether. The content of the organic vehicle is preferably at least 20 mass % and not more than 35 mass %. If the content of the organic vehicle is less than 20 mass % or in excess of 35 mass %, printability of the paste composition is reduced.

Further, the inventive paste composition may contain glass frit. The content of the glass frit is preferably not more than 5.0 mass %. The glass frit, not directly participating in deformation of the p-type silicon semiconductor substrate, the BSF effect and the energy conversion efficiency, is added for improving adhesion between the back electrode layer and the p-type silicon semiconductor substrate after firing. If the content of the glass frit exceeds 5.0 mass %, glass may be segregated.

The glass frit contained in the inventive paste composition may, for example, be prepared from $SiO_2$—$Bi_2O_3$—PbO, $B_2O_3$—$SiO_2$—$Bi_2O_3$, $Bi_2O_3$—$SiO_2$—ZnO, $Bi_2O_3$—$SiO_2$—PbO or the like.

EXAMPLE

An example of the present invention is now described.

First, various types of paste compositions each containing aluminum powder, glass frit and an organic vehicle in the ranges of 60 to 75 mass %, 0 to 5.0 mass % and 20 to 35 mass % respectively as well as inorganic compound powder having characteristics shown in Table 2 in the ratio shown in Table 1 were prepared.

More specifically, each paste composition was obtained by adding aluminum powder and $Bi_2O_3$—$SiO_2$—PbO glass frit to an organic vehicle prepared by dissolving ethyl cellulose in a glycol ether-based organic solvent while further adding the inorganic compound powder shown in Table 1 and mixing the materials with each other in a well-known mixer. In the column of "Type of Inorganic Compound Powder" in Table 1, each parenthesized numerical value shows the mean particle diameter (μm) of the inorganic compound powder.

The aluminum powder was prepared from powder consisting of spherical or spherelike particles of 2 to 20 μm in mean particle size in consideration of assurance of reactivity with a p-type silicon semiconductor substrate, spreadability and homogeneity of an applied film.

Each paste composition was applied to and printed on a p-type silicon semiconductor substrate of 300 μm in thickness and 2 inches (50.8 mm) by 2 inches (50.8 mm) in size with a screen printing plate of 180 meshes and dried. In prior art 2 shown in Table 1, the paste composition was applied to and printed on a p-type silicon semiconductor substrate having a thickness of 350 μm. The quantity of application was so set that the thickness of an electrode reaches 45 to 55 μm after firing.

The p-type silicon semiconductor substrate printed with the paste composition was dried, thereafter heated in an infrared firing furnace in an air atmosphere at a heating rate of 400° C./min. and fired under conditions of holding the same at a temperature of 710 to 720° C. for 30 seconds. After the firing, the p-type silicon semiconductor substrate 1 was cooled thereby forming a back electrode layer 5 as shown in FIG. 1.

Surface resistance of the back electrode layer 5 influencing inter-electrode ohmic resistance was measured. Thereafter the p-type silicon semiconductor substrate 1 formed with the back electrode layer 5 was dipped in aqueous hydrochloric acid thereby dissolving and removing the back electrode layer 5 and an Al—Si alloy layer 6 for measuring the surface resistance of the p-type silicon semiconductor substrate 1 formed with a $p^+$ layer 7 with a four-probe surface resistance measuring apparatus. It is supposed that the surface resistance of the $p^+$ layer 7 correlates to the BSF effect such that the BSF effect is increased as the surface resistance is reduced. The target surface resistance values of the back electrode layer 5 and the $p^+$ layer 7 are not more than 13.0 mΩ/□ and not more than 11.0 Ω/□ respectively.

Figure 2:
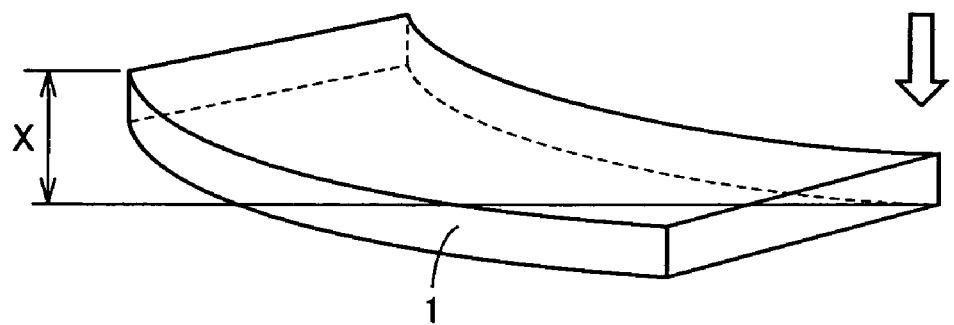
FIG. 2 typically illustrates a method of measuring the quantity of deformation of a fired silicon substrate.

As shown in FIG. 2, deformation of the fired silicon semiconductor substrate 1 was evaluated by upwardly directing the back electrode layer 5 of the silicon semiconductor substrate 1 after firing and cooling and pressing an end of the four corners of the substrate 1 for measuring the quantity (including the thickness of the substrate 1) x of lifting of another end located on the diagonal position. The target quantity x of lifting is not more than 1.0 mm.

Table 1 shows the surface resistance of the back electrode layer 5, the surface resistance of the $p^+$ layer 7 and deformation of the fired silicon (Si) substrate 1 of each sample measured in the aforementioned manner.

TABLE 1

|  |  | Type of Inorganic Compound Powder | Content of Inorganic Compound Powder (mass %) | Surface Resistance of $p^+$ Layer on Si Substrate (Ω/□) | Surface Resistance of Back Electrode (mΩ/□) | Deformation of Si Substrate (mm) |
|---|---|---|---|---|---|---|
| Prior Art | 1 | unadded | 0 | 10.2 | 12.2 | 1.12 |
|  | 2 | unadded | 0 | 9.9 | 12.5 | 0.97 |
| Example | 1 | $SiO_2$(0.4) | 0.5 | 10.0 | 12.3 | 0.98 |
|  | 2 | $SiO_2$(0.4) | 1.0 | 10.1 | 12.3 | 0.93 |
|  | 3 | $SiO_2$(0.4) | 3.0 | 10.1 | 12.4 | 0.75 |
|  | 4 | $SiO_2$(1.6) | 3.0 | 10.2 | 12.5 | 0.79 |
|  | 5 | $SiO_2$(4.0) | 3.0 | 10.2 | 12.6 | 0.86 |
|  | 6 | $SiO_2$(0.4) | 5.0 | 10.3 | 12.8 | 0.61 |
|  | 7 | $SiO_2$(12) | 5.0 | 10.2 | 12.9 | 1.05 |
|  | 8 | $SiO_2$(0.4) | 12.0 | 10.5 | 15.2 | 0.58 |
|  | 9 | $Al_2O_3$(0.4) | 0.5 | 10.1 | 12.2 | 0.98 |
|  | 10 | $Al_2O_3$(0.4) | 1.0 | 10.1 | 12.3 | 0.94 |
|  | 11 | $Al_2O_3$(0.4) | 3.0 | 10.3 | 12.3 | 0.78 |
|  | 12 | $Al_2O_3$(1.0) | 3.0 | 10.2 | 12.5 | 0.81 |
|  | 13 | $Al_2O_3$(2.5) | 3.0 | 10.4 | 12.6 | 0.87 |
|  | 14 | $Al_2O_3$(0.4) | 5.0 | 10.4 | 12.8 | 0.65 |
|  | 15 | $Al_2O_3$(13) | 5.0 | 10.3 | 12.7 | 1.07 |
|  | 16 | $Al_2O_3$(0.4) | 12.0 | 10.6 | 15.0 | 0.60 |
|  | 17 | SiC(0.5) | 3.0 | 10.4 | 12.3 | 0.85 |
|  | 18 | AlN(1.5) | 3.0 | 10.3 | 12.4 | 0.87 |
|  | 19 | $SiO_2$(0.012) | 3.0 | 10.3 | 13.1 | 0.82 |

TABLE 2

| Inorganic Compound | Thermal Expansion Coefficient (× $10^{-6}$/° C.) | Melting Point/ Decomposition Temperature (° C.) |
| --- | --- | --- |
| $SiO_2$ | 0.5~15.0 | 1500 |
| $Al_2O_3$ | 8.1 | 2046 |
| SiC | 3.7 | 850* |
| AlN | 4.5 | 900* |
| Al | 23.5 | 660 |

*oxidation temperature in the atmosphere

It is understood from the results shown in Table 1 that deformation of the fired silicon substrate was remarkably in excess of 1 mm in the conventional paste composition (prior art 1) while such deformation of the fired silicon substrate can be reduced to about or not more than 1 mm by employing the inventive paste composition prepared by adding the inorganic compound powder having the thermal expansion coefficient smaller than that of aluminum and not melted, not softened and not decomposed at the firing temperature to the aluminum powder and the organic vehicle. It is also understood that deformation of the fired silicon substrate can be reduced to about or not more than that of the prior art 2 by applying the inventive paste composition to the silicon substrate having the thickness (300 μm) smaller than that (350 μm) in the prior art 2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A paste composition for forming an electrically conductive layer on a p-type silicon semiconductor substrate, containing aluminum powder, an organic vehicle and powder of at least one inorganic compound selected from a group consisting of an oxide-based inorganic compound and a non-oxide-based inorganic compound, wherein the inorganic compound powder exists independently from the aluminum powder in the paste, wherein said oxide-based inorganic compound has a thermal expansion coefficient smaller than the thermal expansion coefficient of aluminum and a melting temperature, a softening temperature and a decomposition temperature each higher than the melting point of aluminum, and said non-oxide-based inorganic compound has a thermal expansion coefficient smaller than the thermal expansion coefficient of aluminum and one temperature of a melting temperature, a softening temperature and a decomposition temperature higher than the melting point of aluminum, and wherein said powder of at least one inorganic compound is not melted, not softened, and not decomposed at a firing temperature for said paste composition.

2. The paste composition according to claim 1, wherein said oxide-based inorganic compound is at least one compound selected from a group consisting of silicon oxide and aluminum oxide.

3. The paste composition according to claim 1, wherein said non-oxide-based inorganic compound is at least one compound selected from a group consisting of a carbide, a nitride and a boride.

4. The paste composition according to claim 1, containing said powder of said inorganic compound by at least 0.3 mass % and not more than 10.0 mass %.

5. The paste composition according to claim 1, containing said aluminum powder by at least 60 mass % and not more than 75 mass %, said organic vehicle by at least 20 mass % and not more than 35 mass % and said powder of said inorganic compound by at least 0.3 mass % and not more than 10.0 mass %.

6. The paste composition according to claim 1, further containing glass frit.

7. The paste composition according to claim 6, containing said aluminum powder by at least 60 mass % and not more than 75 mass %, said organic vehicle by at least 20 mass % and not more than 35 mass %, said powder of said inorganic compound by at least 0.3 mass % and not more than 10.0 mass % and said glass frit by not more than 5.0 mass %.

8. The paste composition according to claim 1, wherein the mean particle size of said powder of said inorganic compound is not more than 10 μm.

9. A solar cell comprising an electrically conductive layer formed by applying a paste composition onto a p-type silicon semiconductor substrate and thereafter firing said paste composition, wherein said paste composition contains aluminum powder, an organic vehicle and powder of at least one inorganic compound selected from a group consisting of an oxide-based inorganic compound and a non-oxide-based inorganic compound, wherein the inorganic compound powder exists independently from the aluminum powder in the paste, said oxide-based inorganic compound has a thermal expansion coefficient smaller than the thermal expansion coefficient of aluminum and a melting temperature, a softening temperature and a decomposition temperature each higher than the melting point of aluminum, and said non-oxide-based inorganic compound has a thermal expansion coefficient smaller than the thermal expansion coefficient of aluminum and one temperature of a melting temperature, a softening temperature and a decomposition temperature higher than the melting point of aluminum, and wherein said powder of at least one inorganic compound is not melted, not softened, and not decomposed at the temperature at which said paste composition is fired.

* * * * *